United States Patent [19]

Ignasiak

[11] Patent Number: 4,981,441
[45] Date of Patent: * Jan. 1, 1991

[54] TEST CLIP FOR PLCC

[75] Inventor: Martin C. Ignasiak, Painesville, Ohio

[73] Assignee: Minnesota Mining and Manufacturing Co., Saint Paul, Minn.

[*] Notice: The portion of the term of this patent subsequent to Jun. 9, 2004 has been disclaimed.

[21] Appl. No.: 36,379

[22] Filed: Apr. 9, 1987

Related U.S. Application Data

[62] Division of Ser. No. 708,698, Mar. 6, 1985, Pat. No. 4,671,590.

[51] Int. Cl.[5] .............................................. H01R 11/22
[52] U.S. Cl. ..................................... 439/269; 439/711
[58] Field of Search ................... 324/158 F; 339/174, 339/74 R, 75 M, 75 MP, 17 CF, 200 P, 255 P; 439/68–73, 266–270, 711, 713, 725, 729

[56] References Cited

U.S. PATENT DOCUMENTS

| | | | |
|---|---|---|---|
| Re. 28,064 | 7/1974 | Venaleck et al. | 339/174 |
| 3,899,239 | 8/1975 | Allard | 339/255 P |
| 3,914,007 | 10/1975 | Seidler | 339/253 P |
| 4,012,097 | 3/1977 | Long et al. | 339/17 CF |
| 4,116,518 | 9/1978 | Pleskac | 339/17 CF |
| 4,116,519 | 9/1978 | Grabbe et al. | 339/17 CF |
| 4,210,383 | 7/1980 | Davis | 339/200 P |
| 4,491,377 | 1/1985 | Pfaff | 339/74 R |
| 4,536,955 | 8/1985 | Gudgeon | 29/840 |
| 4,541,676 | 9/1985 | Hansen et al. | 339/17 CF |
| 4,556,269 | 12/1985 | Andersson et al. | 339/75 M |

FOREIGN PATENT DOCUMENTS

| | | | |
|---|---|---|---|
| 116266 | 8/1984 | European Pat. Off. | 339/75 M |
| 1934752 | 7/1969 | Fed. Rep. of Germany | |
| 1005227 | 3/1983 | U.S.S.R. | 339/200 P |

OTHER PUBLICATIONS

Advertisement Entitled Power Supplies 7–1985.
P. 13 of ITT Pomona Electronics 1985 Catalog.
"Chip Carrier Sockets", Plastictronics, Inc. 12/1982.
"Burndy, the Leader in DIP Sockets", Burndy Advertisement.
"LCC Test & Burn-In Chip Carrier Sockets", J. M. Ney Company, 11-1983.

*Primary Examiner*—Eugene F. Desmond
*Attorney, Agent, or Firm*—Renner, Otto, Boisselle & Sklar

[57] ABSTRACT

An electrical clip connector for a PLCC or the like comprises a plurality of electrical contacts for electrically connecting with respective leads of the PLCC, a main support body, and two pairs of oppositely disposed latching elements supported by the body for inward and outward movement. The latching elements are inwardly urged for engaging respective different sides of the PLCC thereby to hold the clip connector in operative position. The latching elements of one pair include lower end portions of respective levers pivotally secured to the main support body at respective opposite sides thereof, and the latching elements of the other pair include respective legs depending from the main body portion in cantilever-like fashion. Cam surfaces on the legs are engageable by a wedge-like portion of the lever arms when pivoted to force the legs outwardly in a direction generally parallel to the pivot axes of the lever arms.

24 Claims, 5 Drawing Sheets

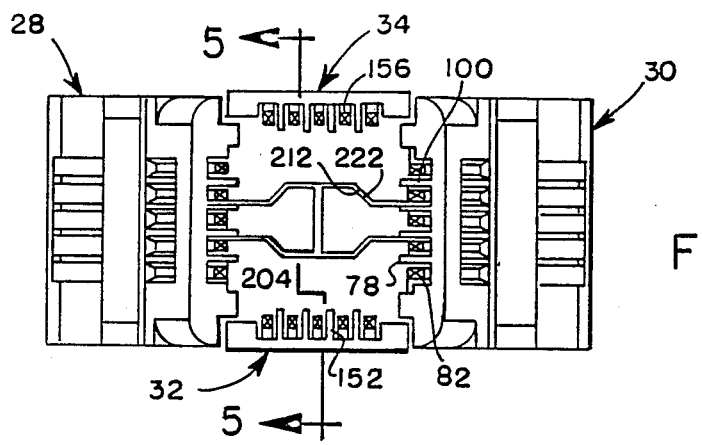
FIG. 4
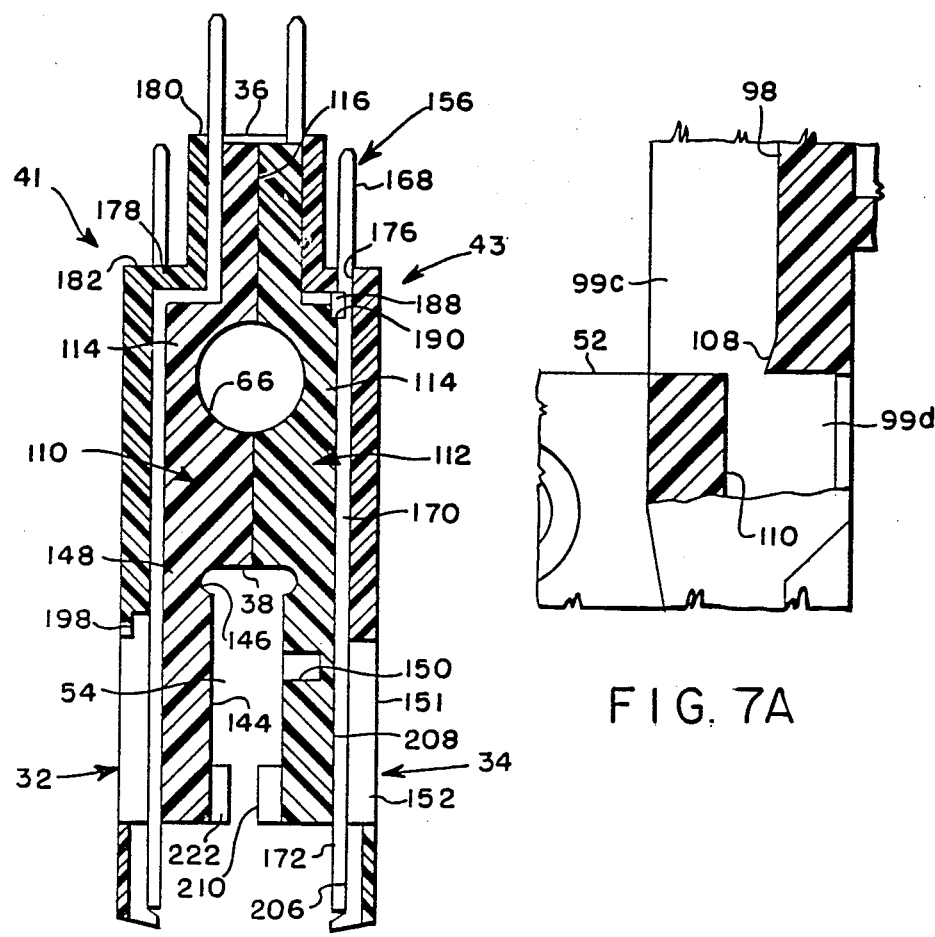
FIG. 7A
FIG. 5

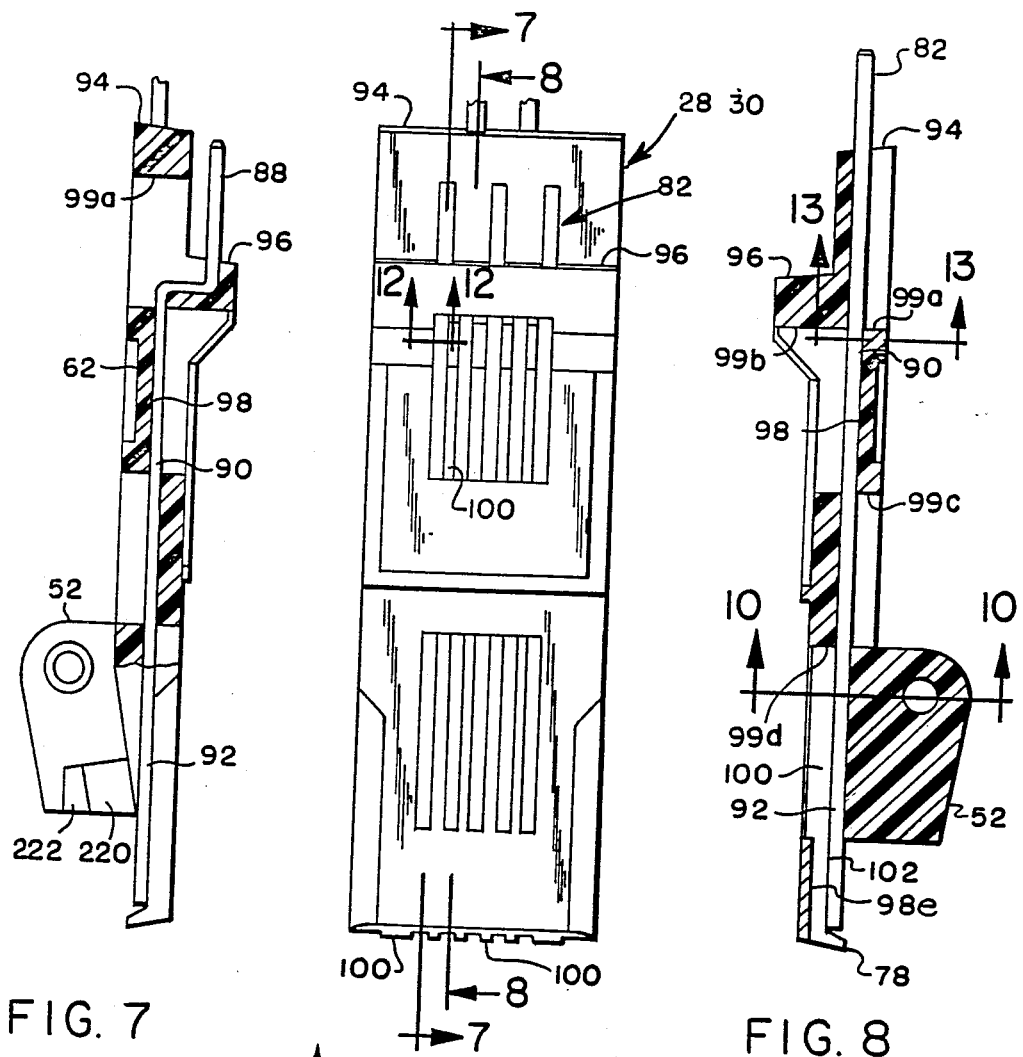

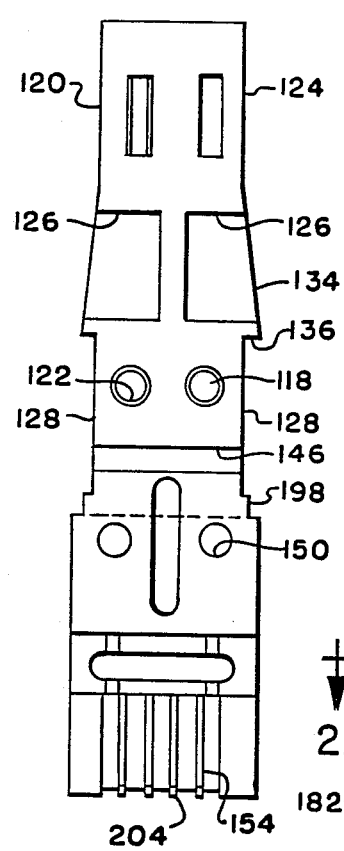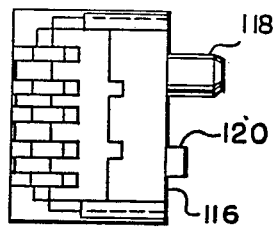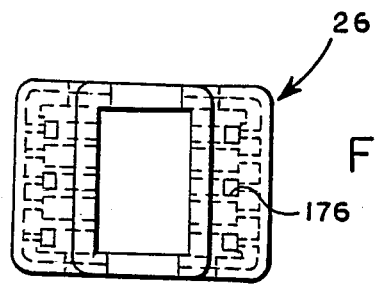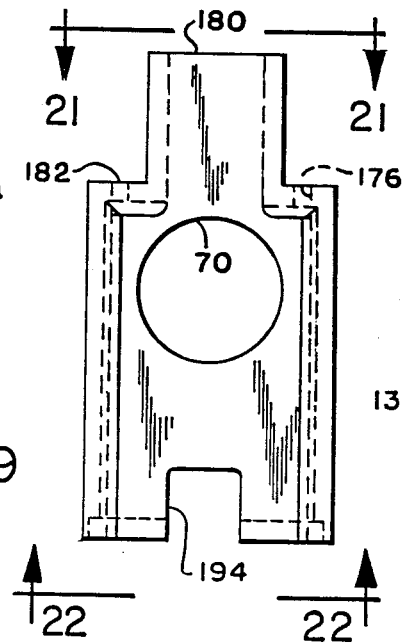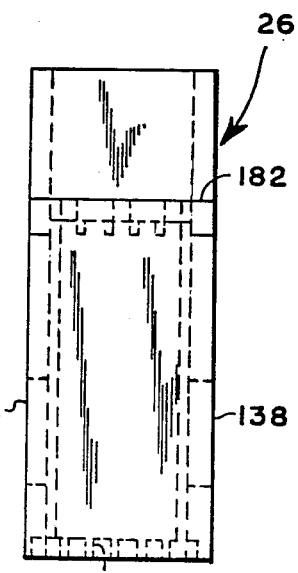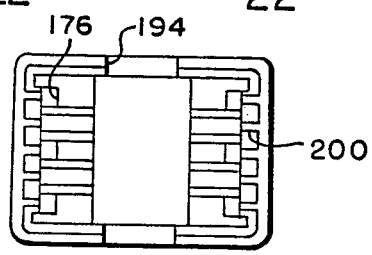

TEST CLIP FOR PLCC

This is a divisional of co-pending application Ser. No. 708,698 filed on Mar. 6, 1985, now U.S. Pat. No. 4,671,590.

DISCLOSURE

The invention herein disclosed relates generally to clip connectors for electronic devices and, more particularly, to a test clip for use with leaded chip carriers.

BACKGROUND

An example of a prior test clip for electronic devices, such as integrated circuits of the dual-in-line (DIP) package type, is disclosed in U.S. Reissue Pat. No. Re. 28,064. The DIP packages may have, for example, a total of from 14 to 64 leads arranged in a pair of parallel rows on the two generally relatively longer parallel sides of the DIP package, and typically the leads are spaced on 0.100 inch centers. The DIP package typically is used by soldering the leads into respective plated-through holes in a printed circuit board or by inserting the leads into a DIP socket already attached to a printed circuit board. For heat dissipation and possibly for other reasons, DIP packages ordinarily are spaced from each other and from other components on a printed circuit board at distances of at least several hundred thousandths inch. The above-mentioned test clip may be used to make electrical connections with each of the leads of a DIP package for signal testing (examination) and/or signal injecting (into the integrated circuit) purposes while the integrated circuit package is in usual mounting and/or use circumstances.

As it is used herein, the term or designation LCC is intended to encompass or to include leaded chip carriers or chip carrier packages that typically consist of one or more circuit chips mounted on a lead frame and encapsulated with an electrically non-conductive encapsulating medium. In one exemplary type the encapsulating medium is of a plastic or plastic-like material— hence the designation PLCC for plastic leaded chip carrier.

An exemplary PLCC is one identified as an "FN plastic chip carrier package" manufactured by Texas Instruments. Such PLCC is of generally square shape in top plan view and may have from 20 to 68 terminals or leads arranged in four equal groups along or proximate to each side of the package. For example, the 20-lead model has five leads per side. The leads are positioned on 0.050 inch (1.27 mm.) centers along each side and each lead has a side portion exposed at the side of the package and a bottom portion exposed at the bottom of the package. Such PLCC may be mounted on the surface of a printed circuit board using a soldering technique to attach mechanically and electrically each lead (at the bottom portion thereof) to a respective solder land on the printed circuit board.

Other PLCC's may have, for example, from about 20 to about 124 total leads arranged at or proximate to respective sides of the PLCC. Although the FN PLCC mentioned above has a generally square configuration in plan view, other PLCC's may be of rectangular shape not necessarily square.

Relative to the space and size requirements for a conventional DIP integrated circuit package, in a given space or area a PLCC may have a larger number of circuits and leads or terminals, this being due, at least in part, to the locating of leads along all four sides of the PLCC and the ability to narrow the spacing between leads in a PLCC relative to the wider spacing in a conventional DIP package. For a number of reasons, such as surface mounting capability, close positioning of leads, and heat producing and/or tolerance characteristics of PLCC's, PLCC's can be mounted on a printed circuit board in relatively closely packed relationship with respectively adjacent PLCC's being spaced apart, for example, by 0.035 inch. Thus, using PLCC's, the capacity, e.g., number of circuits, memory, etc., of a printed circuit board of a given size ordinarily would be larger than the capacity of such a printed circuit board employing conventional DIP integrated circuits.

As with DIP integrated circuit packages, it would be desirable to have a test clip that may be used to make electrical connections with each of the leads of the PLCC for signal testing and/or signal injecting purposes especially while the PLCC is in usual mounting and/or use circumstances. Because the leads are located along each of the four sides of the PLCC, prior test clips for DIP packages generally could not be used effectively even if appropriately sized since they would permit electrical connections with leads at only two opposed sides of the PLCC. There also may be a problem with interference between such prior test clips and an adjacent PLCC spaced, say 0.035 inch, from the PLCC to be tested.

SUMMARY OF THE INVENTION

The present invention provides a clip connector and particularly a test clip that may be used to make electrical connections with each of the leads of a PLCC located at all sides of the PLCC thereby to facilitate electrical access to the respective PLCC leads by an external electrical device such as a cable, a circuit, test equipment, signal injecting equipment and signal analyzing equipment. Advantages afforded by the invention include, inter alia, assurance that the test clip will be properly positioned with respect to the PLCC and held to the PLCC in proper operative position once installed, zero insertion force so as to avoid possible damage to the PLCC and/or its mounting to a circuit board, and a footprint only slightly dimensionally larger than that of the PLCC which enables the test clip to be installed on a PLCC in tight quarters.

Accordingly, particular features that may be included in the test clip are the relatively close positioning of individual contacts corresponding to the spacing of the PLCC leads, the isolation of such contacts from each other, the test clip size enabling the same to be positioned with respect to a PLCC even with the latter in a close-packed arrangement on a printed circuit board or the like, and the facility with which the test clip may be positioned and retained on and removed from a PLCC. It is noted that one or more of these and other features hereinafter more particularly described may be included in a test clip or other clip connector having use with LCC's of various different profiles and/or lead patterns as well as with other types of electrical devices including, for example, DIP integrated circuit packages.

According to one aspect of the invention, an electrical clip connector for an electrical device comprises an electrically non-conductive body having a main body portion and a pair of latching leg portions depending from the main body portion in cantilever-like fashion. The leg portions are resiliently outwardly deflectable to receive therebetween the electrical device and then springable back to engage respective opposite sides of the device to hold the clip connector in operative position with respect to the device. The clip connector further comprises a plurality of electrical contacts supported by the body with contacting portions thereof laterally spaced for electrically connecting with respective leads of the device when the clip connector is held by the leg portions in operative position with respect to the device, and means mounted to the body for effecting resilient outward deflection of the leg portions to permit receipt of the device therebetween. The contacting portions depend from the main body portion in cantilever-like fashion and are generally coextensive with the leg portions while being free to resiliently deflect outwardly in relation to the leg portions.

According to another aspect of the invention, an electrical clip connector for a leaded electrical device comprises a plurality of electrical contacts for electrically connecting with respective leads of the device and support/latching means for supporting the contacts and for retaining the clip connector in operative position with respect to the electrical device. The support/latching means includes a main support body, two pairs of oppositely disposed latching elements supported by the body for inward and outward movement, means for urging the latching elements inwardly for engaging respective different sides of the electrical device thereby to hold the clip connector in such operative position, and means coacting with the latching elements of one pair thereof for moving the latching elements of the other pair outwardly upon outward movement of the latching elements of such one pair. The latching elements of such one pair include lower end portions of respective levers pivotally secured to the main support body at respective opposite sides thereof, and the means for urging includes resilient means for yieldingly biasing the upper end portions of the lever apart. The latching elements of the other pair include respective legs depending from the main body portion in cantilever-like fashion and such legs are resliently outwardly deflectable to receive therebetween the electrical device and then springable back to engage respective opposite sides of the device. The means for moving includes cam surfaces on the legs engageable by a wedge-like portion of the lever arms when pivoted to force the legs outwardly in a direction generally parallel to the pivot axes of the lever arms.

To the accomplishment of the foregoing, other and related ends, the invention, then, comprises the features hereinafter fully described and particularly pointed out in the claims, the following description and the annexed drawings setting forth in detail a certain illustrative embodiment of the invention, this being indicative, however, of but one of the various ways in which the principles of the invention may be employed.

BRIEF DESCRIPTION OF THE DRAWINGS

In the annexed drawings:

FIG. 4 is a bottom plan view of the test clip looking in the direction of the arrows 4—4 of FIG. 1;

FIG. 5 is a vertical section through the test clip taken substantially along the line 5—5 of FIG. 4 with the levers thereof removed for illustration purposes;

FIG. 6 is an outer side elevational view of one of the levers of the test clip;

FIG. 7 is a vertical section through the lever of FIG. 6 taken along the line 7—7 of FIG. 6;

FIG. 7A is an enlarged portion of FIG. 7;

FIG. 8 is a vertical section through the lever taken substantially along the line 8—8 of FIG. 6;

FIG. 10 is a horizontal section through the lever of FIG. 6 taken along the line 10—10 of FIG. 8;

FIG. 11 is a bottom plan view of the lever of FIG. 6 looking in the direction of the arrows 11—11 of FIG. 6;

FIG. 16 is an interior side elevational view of the body half of FIG. 14;

FIG. 18 is a top plan view of the body half of FIG. 14 looking in the direction of the arrows 18—18 of FIG. 15;

FIG. 19 is an end elevational view of a cover which fits on the upper portions of the mated body halves of the test clip;

FIG. 20 is a side elevational view of the cover of FIG. 19;

FIG. 21 is a top plan view of the cover of FIG. 19 looking in the direction of the arrows 21—21 of FIG. 19; and FIG. 22 is a bottom plan view of the cover of FIG. 19 looking in the direction of the arrows 22—22 of FIG. 19.

DETAILED DESCRIPTION

Figures 1, 2, 3:
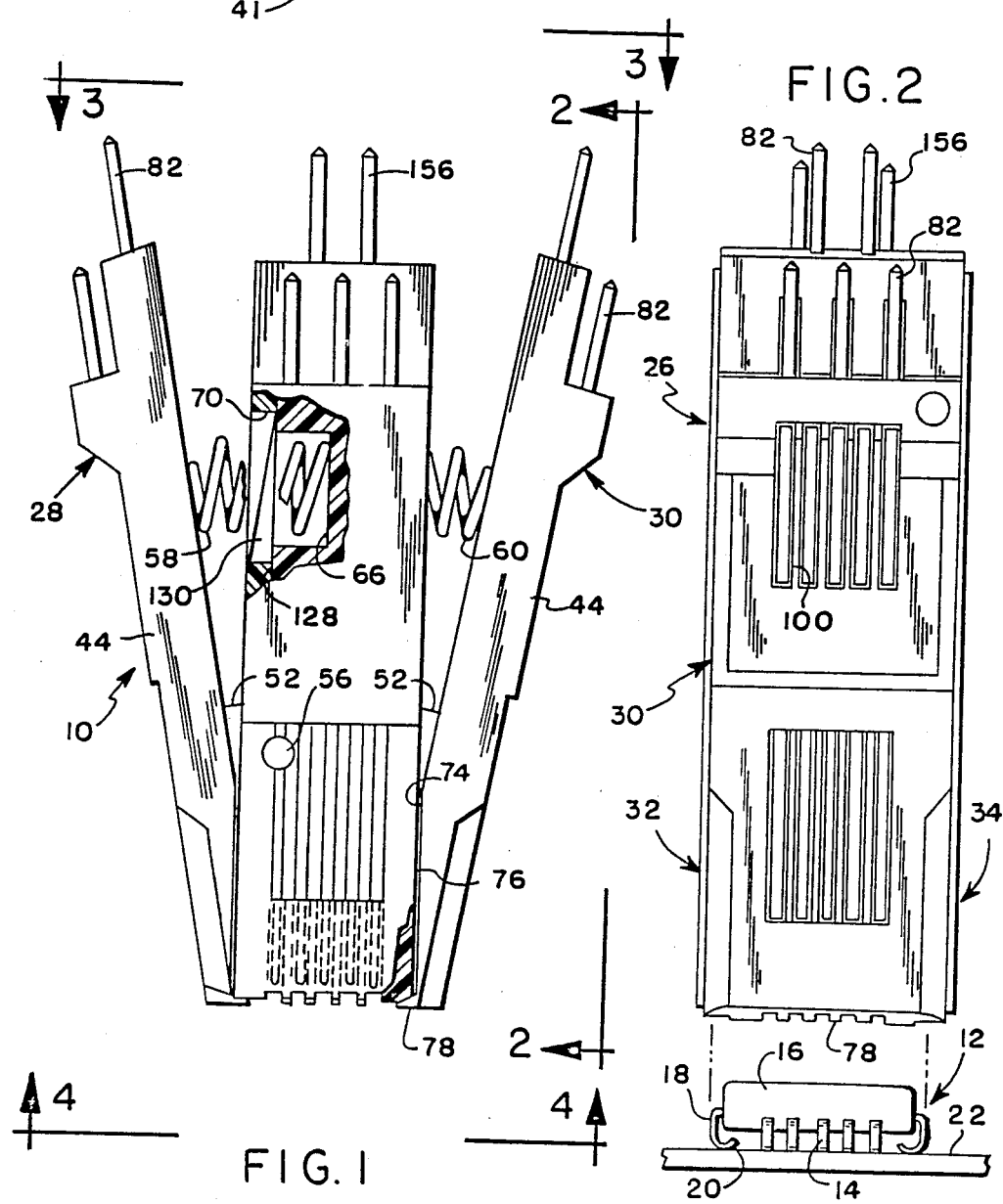
FIG. 1 is a side elevational view, partly broken away in section, of a test clip according to the invention.
FIG. 2 is an end elevational view of the test clip looking in the direction of the arrows 2—2 of FIG. 1 and showing the test clip exploded relation to a plastic leaded chip carrier (PLCC) to which the test clip may be connected.
FIG. 3 is a top plan view of the test clip looking in the direction of the arrows 3—3 of FIG. 1.
Figure 9:
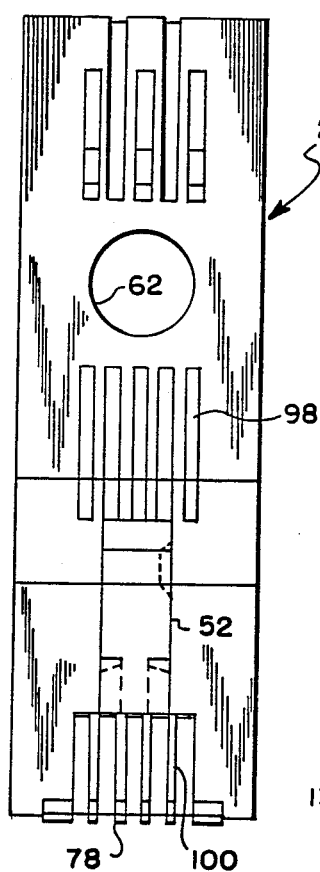
FIG. 9 is an inner side elevational view of the lever of FIG. 6.

In the following detailed description reference will be made to a test clip having particular use with a plastic leaded chip carrier (PLCC), for according to the preferred embodiment and best mode of the invention, the device thereof is intended for use to test the operability of and the functions of a PLCC and/or other device to which the PLCC may be connected. However, it will be appreciated that a device according to the invention, such as an electrical clip connector including one or more features of the invention, may be used with devices other than PLCC's, with LCC's of different types than that herein shown and illustrated, and with other devices as well, and for electrical connection purposes other than testing purposes. References to a PLCC are intended to be exemplary references to a device to which the test clip (electrical connector) of the invention may be connected. However, respecting a test clip according to the preferred embodiment and best mode of the invention, the PLCC or similar device has leads located along each of more than two sides and particularly four sides of a rectangular PLCC to which the test clip contacts may be connected as hereinafter described. Also, reference to a lead herein generally may be construed as a reference to an electrically conductive member, such as a lead, contact or terminal associated with the PLCC or other electrical (electronic) device to which the test clip (electrical connector) of the invention may be connected. References to electrical and to electronic are used equivalently herein. References to vertical and horizontal, top and bottom, upper and lower, etc., are used for convenience in description and not by way of limiting the test clip to a specific orientation inasmuch as the spatial orientation of the test clip will be dependent on the particular application made of the test clip.

Referring now in detail to the drawings and initially to FIGS. 1-4, a test clip according to the invention is designated generally by reference numeral 10. The test clip 10 according to the preferred embodiment and best mode of the invention, is intended to facilitate electrical access to respective leads of a plastic leaded chip carrier (PLCC), as when the PLCC is surface mounted to a printed circuit board. A PLCC, indicated generally at 12 in FIG. 2, has a generally square configuration in top plan view with leads 14 arranged in groups (rows) respectively along the four sides of the PLCC body 16 of electrically non-conductive plastic or plastic-like material which encapsulates a circuit chip electrically connected to the leads 14. Each lead 14 has a side portion 18 extending out of and downwardly along the respective side of the plastic body 16 and a reversely turned bottom portion 20 exposed at the bottom of the package as for connection to a respective solder land on a printed circuit board 22.

The major discrete components of the test clip 10 include a body 24, a cover 26 and a pair of hinged levers 28 and 30 which can pivot relative to each other and also the body 24. The cover 26 is fitted onto the upper or main body portion of the clip body 24 from which a pair of spaced apart, generally parallel legs 32 and 34 depend in cantilever-like fashion as seen in FIG. 5. The main body portion of the clip body generally is rectangular in horizontal cross-section as is preferred for use of the test clip with a PLCC having a generally rectangular configuration including, by definition, a square configuration. The main body portion accordingly has four sides, as does not cover 26, and also a top end and a bottom end respectively indicated at 36 and 38 in FIG. 5. The four sides of the test clip are indicated generally by reference numerals 40-43. The levers 28 and 30 generally are associated with opposite sides 40 and 42 whereas the legs 32 and 34 generally are associated with opposite sides 41 and 43. As discussed further below, the lower ends of the levers and legs together form respective expandable/contractible sides of a four-sided socket which receives the PLCC 12 with the levers and legs disposed at respective sides of the PLCC.

The levers 28 and 30 preferably are identical although oppositely disposed. Each lever 28, 30 has an elongated body 44 of electrically non-conductive material and preferably the body 44 is molded from a plastic or plastic-like material. The lever body 44 preferably is about equal in length to the clip body 24. Projecting inwardly from a medial portion of each lever is a centrally located ear 52 of considerably less width that is received in a slot 54 (FIG. 5) formed between the spaced-apart upper portions of the legs 32 and 34. The ears 52 of the levers are at respective side portions of the slot 54 and each is fixed therein for pivotal movement by a respective pivot pin 56 extending through bores in the ears. The pivot pins 56 are parallel and equally spaced from the vertical center plane of the test clip extending perpendicular to the front and back sides 41 and 43. Further particulars of the hinge mount for the levers are discussed below in connection with FIGS. 6-10.

The upper portions of the levers 28 and 30 are resiliently urged outwardly away from the cover 26 by respective compression springs 58 and 60, although other springs or biasing means alternatively may be used. The outer end of each spring 58, 60 is received in and located by a shallow circular recess 62 provided at the inner side of the respective lever. The other or inner end of each spring 58, 60 is received and located by a respective bore 66 in the clip body 24. The bores 66 are closed at their inner ends and aligned with respective holes 70 in the cover 26 through which the springs pass out of the clip body for engagement with the levers.

By the action of the springs 58 and 60, the levers 28 and 30 are biased to an unactuated position determined, in the illustrated embodiment, by engagement of their lower end portions at inner surfaces 74 with respective end or lateral edge surfaces 76 of the depending legs 32 and 34. At this position, inwardly protruding teeth 78 at the distal ends of the lower or gripping portions of the levers are spaced apart a distance less than the corresponding width of the PLCC 12 to which the test clip is sized for connection. Such teeth 78 are intended to fit beneath the body 16 of the PLCC, as between the underside of the PLCC body 16 and the printed circuit board 22 to which the PLCC is mounted, to hold the test clip to the PLCC.

As seen in FIGS. 1-4, plural electrically conducting, elongate members, i.e., contacts 28, 30 in laterally spaced apart relationship. In the illustrated test clip intended for use with a 20-lead PLCC, five contacts 82 are provided in each lever 28, 30 in generally parallel and closely packed relationship so that generally linear contacts may be used to effect electrical connections with the five leads at the corresponding side of the PLCC that may be positioned, for example, on 0.050 inch centers.

With additional reference to FIGS. 6-8, each contact 82 includes an upper coupling portion 88 for electrically coupling to another electrical device such as a cable, lead, contact, terminal, test probe, etc., an intermediate mounting portion 90 securely fixed in the lever body, and a contacting portion 92 for electrically contacting a respective lead 14 of the PLCC. The mounting and connecting portions 90 and 92 of the contacts 82 essentially are laterally coplanar except that the mounting portion of every other contact, specifically the second and fourth contacts, has a portion bent outwardly and then upwardly to stagger the respective coupling portions 88 outwardly in relationship to the coupling portions of the other contacts. Also, the top end of the lever body is stepped at 94 and 96 such that the coupling portions of the alternating contacts project equal distance from such stepped surfaces 94 and 96 but at respective different planes or levels. The advantage of this is that the coupling portions at each plane will have a center-to-center spacing greater than that of the leads of the PLCC and, in the illustrated embodiment, twice the center-to-center spacing of the leads of the PLCC. For a PLCC with a 0.050 inch spacing of the leads, the coupling portions in each thusly staggered row accordingly will have a 0.100 inch center-to-center spacing which is a standard spacing for many electrical connectors such as cable end terminations which may, for example, be plugged onto the coupling portions in a respective row thereof. The greater spacing and vertically staggered relationship of the coupling portions of relatively adjacent contacts also reduces the possibility of a short circuit as when a test probe is used to contact the coupling portion of a contact.

In the illustrated preferred embodiment and as seen in FIGS. 7–11, the body 44 of each lever 28, 30 is formed with laterally spaced-apart, longitudinally extending slots 98 in which the contacts 82 are respectively received. The slots 98 each have respective vertical portions thereof formed by vertically offset grooves 99a–e which alternately open to the inside and outside surfaces of the lever body. As seen in FIGS. 7 and 8, the grooves 99a–e overlap at about the vertical center plane of the lever body to provide the respective longitudinally continuous slot 98. As seen at the top of FIG. 7, the grooves 99a associated with the second and fourth contacts are open to both the inside and outside surfaces of the lever body and further are stepped to accommodate the correspondingly bent portion of the contacts.

The wall portions which define the slots 98 or grooves 99, and which thus serve to laterally separate and guide the contacts 82, are herein referred to as separators and designated by reference numeral 100. At their lower ends the separators are respectively provided with the aforementioned jaw-like teeth 78 which protrude inwardly from the coplanar inner surfaces 102 of the separators at their lower ends.

Figure 12:
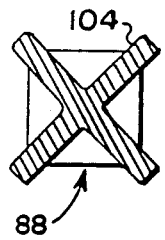
FIG. 12 is a section through one of the contacts in the lever taken along the line 12—12 of FIG. 6.
Figure 13:
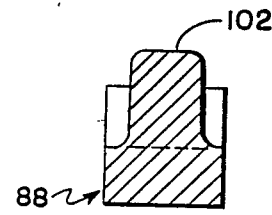
FIG. 13 is a section through another contact in the lever taken along the line 13—13 of FIG. 8.

The bottom surfaces of the grooves 99a–c and the side surfaces of the separators 100 serve to laterally locate the contacts 82 at their mounting portions 90. The contacts also are longitudinally locked in the lever body 44 as by the provision of locking ears formed by swaging or otherwise deforming a portion of the contacts to increase a cross-sectional dimension of the contacts. As seen in FIG. 13, the bent second and fourth contacts in each lever 28, 30 may be pinched to form a protruding ear 102. Also, as seen in FIG. 12, the straight first, third and fifth contacts may be deformed at each side to form a protruding ear 104 at each corner of the contacts which otherwise may be square in cross section. Accordingly, the contact at the ears will be of greater dimension for tight wedging in the respective slot in the lever body.

When the contacts 82 are assembled in the lever body as shown in FIGS. 7 and 8, the mounting portion 90 of each contact is fixed in the lever body. On the other hand, the contacting portion 92 of each contact is supported in cantilever-like fashion for outward deflection in the respective slot 98 and particularly the grooves 99d and e. The grooves 99d and e are sufficiently deep to allow such outward deflection or flexure of the contacting portion of the contact in relation to the lower end of the lever body.

As seen in FIG. 7A a small inwardly protruding bead 108 is provided at the lower end of the bottom surface of each groove 99c, i.e., at the point of cantilevered support for the connecting portion 92 of the contact. The small bead 108 serves to urge or preload the contacting portion of the contact against the bottom surface 110 of the groove 99d to ensure proper position of the contacting portion when in its unflexed or least flexed condition.

To provide for engagement of the contacting portions 92 of the contacts 82 with proper respective leads of the PLCC, the separators 100 and teeth 78 located between adjacent contacting portions, i.e., the laterally inner separators and teeth, have at their lower gripping ends a thickness less than the spacing between relatively adjacent leads of the PLCC such that they may pass between such leads and preferably into engagement with the respective sides of the PLCC body. On the other hand, the laterally outer separators and teeth preferably have a width greater than the spacing between the leads of the PLCC to prevent misaligned installation of the test clip on the PLCC and for greater protection against breakage of such teeth at the more exposed bottom corners of the lever. The relative thicknesses of the separators at their lower end portions is best seen at the bottom of FIG. 6.

As seen in FIG. 5, the clip body 24 is formed by two preferably identical parts or halves 110 and 112 of electrically non-conductive material. The upper portions 114 of the body halves 110 and 112, when mated, together form the upper or main body portion of the clip body from which the legs 32 and 34, i.e., the lower portions of the body halves, depend in cantilever-like fashion. Preferably both body halves 110 and 112 are molded from plastic or plastic-like material having suitable flexibility, strength, toughness and dielectric properties, and the lever bodies 44 may be made from the same material. One such material is a polycarbonate sold under the trademark LEXAN 141 by General Electric of Cincinnati, Ohio. For convenience and economy in molding, the body halves preferably are identical as above noted, but oppositely disposed for mating engagement along the longitudinal center plane of the test clip between the opposed sides 41 and 43.

A preferred configuration of each body half 110, 112 is illustrated in FIGS. 14–17. As shown, each body half may have a planar parting surface 116 from which project a pilot or locating pin 118 and tab 120. The pin 118 and tab 120 are respectively horizontally aligned with a correspondingly sized hole 122 and slot 124, and the centers of the pin and hole are equidistant from the longitudinal center line of the body half as are the centers of the tab and slot. When the body halves are mated, the pin and tab of each body half will fit into the hole and slot of the other body half properly to align the body halves with respect to each other.

Between the pin 118 and tab 120 each body half 110, 112 has a pair of semicircular grooves 126. When the body halves are mated at their parting surfaces 116, the grooves 126 of each body half form with respective grooves of the other body half respective ones of the above indicated pair of coaxial circular holes 66 which, as best seen in FIG. 1, are closed at their adjacent inner ends and open at their outer ends to respective opposite surfaces 128 of the main body portion of the clip body. Each circular hole is sized to receive the inner end of the respective compression spring 58, 60.

Figures 14, 15:
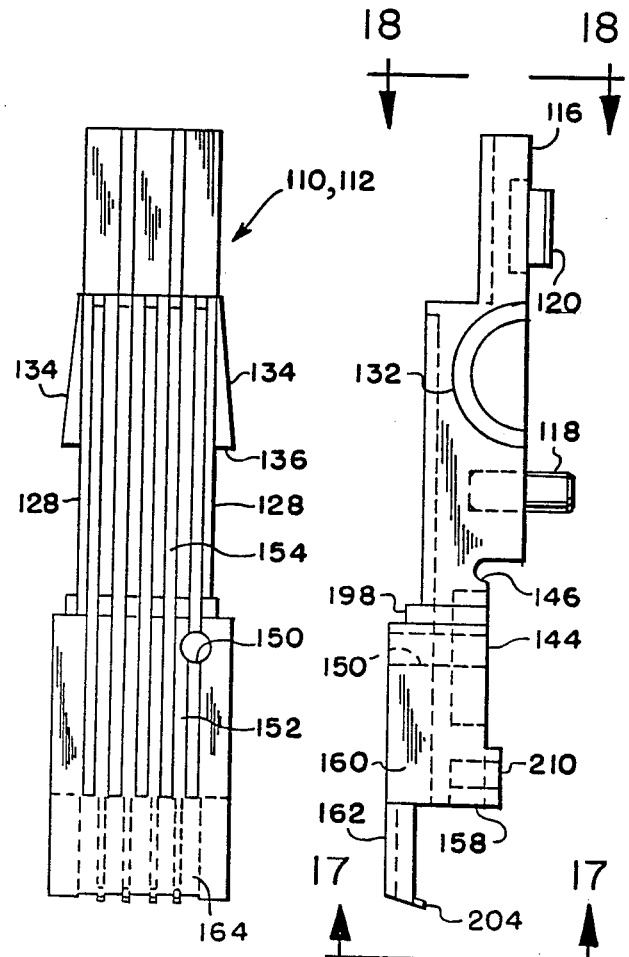
FIG. 14 is an outer side elevational view of a body half which mates with an identical body half to form the body of the test clip.
FIG. 15 is an end elevational view of the body half of FIG. 14.
Figure 14A:
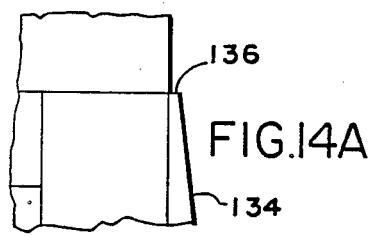
FIG. 14A is an enlarged portion of FIG. 14.

The end surfaces 128 of the main body portion of the clip body 24 are generally parallel and planar except that a respective ramp-like latching boss or ear 130 that circumscribes the open end of the respective circular holes 66. In FIGS. 14–16, each body half 110, 112 can be seen to contribute a semicircular half portion 132 to each latching boss 130. Each latching boss (or half portion thereof) has an outer ramp surface 134 that slopes outwardly at a small acute angle to the respective side surface 128 going from top to bottom. Also, each latching boss has a circular side edge surface 136.

The latching bosses 130 provide a lock between the cover 26 and the clip body 24 when the former is fitted onto the latter. As seen in FIGS. 19-22, the cover 26 generally has a four-sided tubular configuration which is dimensioned to telescope closely over the main body portion of the clip body, i.e., the upper portions of the body halves 110 and 112. The side walls 138 of the cover corresponding to the side surfaces 128 of the clip body each has the above mentioned circular hole 70 sized and positioned to receive a respective one of the latching bosses 130.

Like the clip body halves 110, 112, the cover 26 preferably is of molded plastic or plastic-like material such as the above noted polycarbonate material. When the cover is telescoped onto the main body portion of the clip body, the side walls 138 of the cover will resiliently yield to allow passage of the latching bosses 130 until they snap into the holes 70. Such passage is facilitated by the ramp-like configuration of the latching bosses. Once aligned the bosses will seat in the holes 70 with their side edges 136 engaging the interior surface of the holes firmly and securely to hold the cover in place on the clip body. Also, the cover will hold securely together the upper portions of the body halves in their properly mated relative positions to form the main body portion of the clip body.

As above indicated, the lower portions or legs 32 and 34 of the body halves 110 and 112 depend in cantilever-like fashion from respective upper portions of the body halves. Each leg is resiliently deflectable away from the other leg in a direction normal to the parting surfaces 116 of the body halves. The inside surfaces 144 of the legs are recessed from the parting surfaces 116 and form therebetween the above indicated slot 54 extending downwardly from the bottom 38 of the main body portion of the clip body as seen in FIG. 5. At the top of the slot 54 the inside surface 144 of each leg is further recessed as by the provision of a semicircular groove 146 that defines a reduced thickness resiliently deformable web 148 which integrally joins the leg to the main body portion of the clip body. The amount of force required to deflect the leg outwardly relative to the main body portion may be determined by properly selecting the size of the groove 146 or more particularly the thickness of the web 148.

The slot 54 formed between the legs 32 and 34 is sized to receive therein the ears 52 of the levers 28 and 30 for pivotal mounting of the lever to the clip body at a respective opposite end thereof. As seen in FIGS. 5 and 16, each leg is provided with bores 150 which align with the respective bores in the other leg to receive respective ends of the pivot pins 56. As will be appreciated, the levers and pivot pins may be assembled to one body half, and then the body halves mated and the cover telescoped into place.

As further seen in FIGS. 5 and 14, each body half includes at its outer side 151 a plurality of laterally spaced-apart, wall-like separators 152. The separators 152 extend longitudinally along the upper portion of each body half and also the upper portion of each leg to form outwardly opening recesses or slots 154 sized to accommodate respective elongated electrically conductive members, i.e., contacts 156. As seen in FIG. 15, the separators also extend beyond the bottom 158 of the upper leg portion 160 to form finter-like extensions 162 outwardly offset from the bottom surfaces of the slots 154. As is preferred, the finger-like extensions 162 of the separators are integrally joined at their outer side edges by a spacer wall 164. Accordingly the extensions of the separators form therebetween extensions of the slots that open inwardly rather than outwardly.

In the illustrated test clip embodiment for a PLCC having five leads at each side, five contacts 156 are provided at the outer side 151 of each body half 110, 112 and are separated, located and guided by the separators 152 for alignment with respective leads 14 of the PLCC 12. The contacts are closely packed although separated so that generally linear contacts may be used to effect electrical connection with the PLCC leads that may be positioned, as above noted, on 0.050 inch centers. Each contact includes an upper coupling portion 168, an intermediate mounting portion 170 and a lower depending connecting portion 172 as indicated in FIG. 5.

The mounting portion 170 of each contact 156 is coextensive with the upper portions of the body halves 110, 112, i.e., the main body portion, and are held in the slots 154 by the cover 26 telescoped over the main body portion. The cover accordingly closes the outer side of each slot to form a respective closed passage for the contact.

As seen in FIGS. 1-5, the mounting portions 170 of the contacts 156 at each side of the main body portion are essentially laterally coplanar except that the mounting portions of every other contact, specifically the second and fourth contacts, each have a portion bent inwardly and then upwardly to stagger the respective coupling portions 168 inwardly in relationship to the coupling portion of the other (first, third and fifth) contacts. At the inward bend of the second and fourth contacts each body half is inwardly stepped as is the top end of the cover 26 such that each bent contact continues along its respective slot. On the other hand, the unbent contacts continue upwardly through respective holes 176 in the horizontal wall portion 178 of the cover. As further shown in FIG. 5, the coupling portions 168 extend equally beyond respective stepped upper surfaces 180 and 182 of the cover at respective different planes or levels. Advantages of this have already been discussed with respect to the coupling portions of the contacts in the levers.

As will be appreciated, assembly of the contacts 156 in the clip body 24 may be accomplished by first placing the contacts in their respective slots 154 in the body halves 110 and 112 and then telescoping the cover 26 over the mated body halves. The bent contacts will be securely held against longitudinal movement relative to the clip body by reason of each having an inwardly bent portion trapped between longitudinally opposed horizontal surfaces of the cover and clip body. On the other hand, the unbent contacts may be longitudinally locked in place by the provision of an ear 188 thereon which locks in a corresponding recess 190 between the clip body and cover. The ear may be formed from the contact by permanently deformably flattening a portion thereof to provide the illustrated outwardly protruding flattened ear. Of course other means may be used to securely hold the contacts in place.

When assembled onto the clip body 24 the cover 26 at its lower end may overlap the deformable web 148 as shown in FIG. 5. The cover, as seen in FIG. 19, also has slots 194 formed centrally in the walls 138 thereof corresponding to the lever ends of the test clip to accommodate the ears 52 of the levers 28, 30.

As further seen in FIG. 5, the portion of each separator 152 below the cover 26 is outwardly enlarged and preferably has the outer side 151 thereof flush with the respective outer side of the cover. The top of each outwardly enlarged separator portion may be stepped as seen at 198 and the lower edge of the respective cover side wall may be correspondingly recessed as seen at 200 in FIG. 22 to accommodate the stepped top surface of such enlarged portion.

Each finger-like extension 162 of the separators 152 is provided at its bottom end with a jaw-like tooth 204 which protrudes inwardly from the inner surface 206 of the finger-like extension. As seen in FIG. 5 the inner surface of each finger-like extension is offset outwardly from the plane of the bottom surfaces 208 of the slots 154 by an amount approximately equal the outer to inner thickness of the contacts. In the unflexed or least flexed position of the legs 32 and 34 shown in FIG. 5, the teeth at opposite sides of the clip body will be spaced apart a distance less than the corresponding width of the PLCC to which the test clip is sized for connection. Such teeth are intended to fit beneath the body of the PLCC as between the underside of the PLCC body and the printed circuit board to which the PLCC is mounted to hold the test clip to the PLCC along with the gripping function effected by the lever arms.

As above indicated, the resiliently deformable webs 148 permit outward deflection of the legs 32 and 34 away from each other in a direction perpendicular to the pivot axes of the lever arms. As a result, the space in between the teeth 204 on each leg may be increased to an amount greater than the corresponding width of the PLCC to enable positioning of the legs at respective sides of the PLCC. Such outward deflection is effected by engagement of cam surfaces on the legs and levers when the levers are pivoted by squeezing of their upper portions towards one another.

Figure 17:
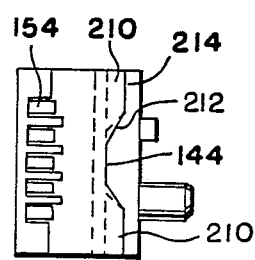
FIG. 17 is a bottom plan view of the body half of FIG. 14 looking in the direction of the arrows 17—17 of FIG. 15.

As seen in FIGS. 15 and 17, each leg 32, 34 is provided with a pair of laterally spaced apart lands 210 which protrude inwardly from the surface 144 at the lower end of such surface. The lands 210 at their relatively adjacent ends are sloped as shown to form respective cam surfaces 212. Each cam surface 212 slopes from the top surface 214 of the land to a lower continuation of the surface 144 between the lands. As further shown, the top surfaces 214 of the lands are outwardly recessed in relation to the parting surface 116 of the respective body half 110, 112. When the body halves are assembled together, the top surfaces 214 of the lands of each body half accordingly will be spaced from those of the other body half but less than the spacing between the surfaces 144 defining the slot 54.

In relation to the lands 210, the ears 52 of the lever arms 28 and 30 have at their lower ends a portion 220 of reduced thickness equal or slightly less than the normal spacing between a respective pair of opposed lands 210. When the lever ears are positioned and pinned in the slot 54 between the legs, their reduced thickness portions 220 will be accommodated between respective pairs of opposed lands 210 as best seen in FIG. 4.

The reduced thickness portion of each lever arm ear is formed by recesses at each side surface of the respective ear. As seen in FIGS. 4, 7 and 11, the innermost side of each recess is defined by a cam surface 222 which slopes from the bottom of each recess to the outer side surface of the lever arm ear. The cam surfaces 222 at the sides of the lever arm ears are laterally aligned and together define a wedge-like portion 224 of the lever arm ear.

The wedge-like portions 224 of the lever arm ears normally are located inwardly of the lands in a direction perpendicular to the pivot axes of the levers as seen in FIG. 4. Also, the cam surfaces 222 of the lever arm ears will be located inwardly adjacent respective cam surfaces 212 of respective lands 210 on the legs 32 and 34.

When the lever arms are actuated by squeezing their upper end portions towards one another, their lower end portions will move away from one another in a direction perpendicular to the pivot axes of the levers. As the lower end portions of the lever arms separate, the cam surfaces 222 of the lever arm ears will engage the cam surfaces 212 thereby forcibly to move the legs 32 and 34 away from one another in a direction parallel to the pivot axes of the lever arms. That is, the engagement and relative movement of respective cam surfaces 212 and 222 give rise to a wedging action which serves to deflect the legs 32 and 34 outwardly away from one another.

In the foregoing manner, the legs 32 and 34 are deflected outwardly to enable positioning of the legs at respective sides of the PLCC. Also, the lower end portions of the lever arms 28 and 30 will be swung outwardly to increase the spacing therebetween to enable their positioning at respective other sides of the PLCC. With the upper portions of the legs squeezed to a position closely adjacent the relatively adjacent sides of the cover, the test clip may then be installed onto a PLCC with the lower end portions of the levers and legs located at respective sides of the PLCC. Once thusly positioned, the lever arms may be released such that the springs 58 and 60 will cause the upper portions of the lever arms to move away from each other with their lower end portions correspondingly moving towards one another for positioning of the teeth thereon beneath the PLCC body at respective sides thereof. As the lever arms are returned to their normal positions by the springs, the legs will spring back towards one another to position the teeth thereon beneath the PLCC body at respective other sides of the PLCC. As a result, the test clip will now be held to the PLCC.

As the lower end portions of the lever arms 28 and 30 move towards the PLCC body, the intermediate separators 100 will fit between relatively adjacent leads of the PLCC thereby properly to locate respective contacts in alignment with respective PLCC leads. Also, the contacts 82 will move into engagement with respective leads of the PLCC. Since the normal spacing between opposed leads of the lever arms is less than the distance between opposed leads of the PLCC, the PLCC leads will cause the contacting portions 92 of the lever arm contacts to deflect outwardly relative to the lower end portions of the lever arms as the latter move into engagement with respective sides of the PLCC body. In the clamped position of the lever arms, the inherent resiliency of the cantilevered contacting portions of the contacts will provide a spring-like effect to hold forcibly the contacts securely in engagement with the leads of the PLCC.

During outward deflecting of the legs 32 and 34, the contacting portions 172 of the contacts 156 will move outwardly with the legs 32 and 34 in view of their engagement with the bottom surfaces 208 of the recesses 154 at the legs. Accordingly, the contacting portions of the contacts at their lower ends will be separated from opposed contacts by an amount greater than the spacing between opposed leads of the PLCC at respective opposite sides of the PLCC. However, as the legs return to their normal clamping position upon release of the lever arms, the inherent resiliency of the contacts 156 will cause the same to move inwardly into engagement with respective leads of the PLCC independently of the legs. Also, the inherent resiliency of the cantilevered contacting portions 172 of the contacts 156 will serve to hold forcibly the contacting portions of the contacts securely in engagement with the contacts after the legs have moved into their clamping positions. This results from the ability of the contacting portions of the contacts to flex outwardly independently of the legs. It also is noted that the reactionary forces on the contacts resulting from their being held outwardly flexed by engagement with the PLCC leads mostly will be transferred to the main body portion of the test clip and not to the legs 32 and 34. Accordingly, such reactionary forces will not oppose the inherent resilient force of the legs that serve to hold the legs in clamping relationship to the PLCC body.

Although the invention has been shown and described with respect to a preferred embodiment, it is obvious that equivalent alterations and modifications will occur to others skilled in the art upon the reading and understanding of this specification. The present invention includes all such equivalent alterations and modifications, and is limited only by the scope of the following claims.

I claim:

1. An electrical clip connector for connecting conductive elements of an external device to conductive elements of a chip carrier or other electrical component having a generally rectangular body and plural conductive elements at each side of the rectangular body, comprising:
   a generally rectangular arrangement of electrical contact means including a plurality of said contact means at each side of said rectangular arrangement of contact means for effecting electrical connection between conductive elements of the external device and conductive elements of the electrical component at a corresponding side of the electrical component, each contact means having a contacting portion for electrically connecting with a respective conductive element of the electrical component, a coupling portion for electrically connecting with a conductive element of the external device, and a mounting portion;
   support/latching means for supporting said contact means at their mounting portions in a generally rectangular arrangement and for holding said clip connector to the electrical component in operative position, said support/latching means including at least two latching elements mounted with respect to one another at respective opposite sides of said rectangular arrangement of contact means for inward and outward movement towards and away from one another, means for urging said latching elements inwardly for gripping engagement with respective opposite sides of the electrical component, and hand operable means for urging said latching elements outwardly, each latching element including means coacting with at least one of the contact means at the corresponding side of said rectangular arrangement of contact means to cause the contacting portion of said at least one of said contact means to move outwardly therewith.

2. A clip connector as set forth in claim 1, wherein said plurality of said contact means includes a plurality of generally parallel, elongated electrical contacts, each said contact having a forward end portion forming said contacting portion, a rearward end portion forming said coupling portion, and a portion intermediate said end portion forming said mounting portion.

3. A clip connector as set forth in claim 1, wherein said means for urging includes resilient means for yieldingly biasing said latching elements inwardly for gripping engagement with respective opposite sides of the electrical component.

4. A clip connector as set forth in claim 3, wherein said support/latching means includes four latching elements mounted with respect to one another at respective different sides of said rectangular arrangement of contact means for inward and outward movement.

5. A clip connector as set forth in claim 1, wherein said support/latching means includes four latching elements mounted with respect to one another at respective different sides of said rectangular arrangement of contact means for inward and outward movement.

6. A clip connector as set forth in claim 5, wherein two of said four latching elements include lower end portions of respective levers mounted with respect to one another for relative pivoting-like movement at respective opposite sides of said rectangular arrangement.

7. A clip connector as set forth in claim 6, wherein said levers have respective upper end portions adapted to be squeezed towards one another to effect outward movement of said lower end portions.

8. A clip connector as set forth in claim 6, wherein said lower end portions of said levers include inwardly protruding teeth for engaging the underside of the electrical component when pivoted therebeneath.

9. A clip connector as set forth in claim 6, wherein said lower end portions of said levers include a plurality of wall-like separators for separating the contacting portions of said contact means at the corresponding sides of said rectangular arrangement of contact means.

10. A clip connector as set forth in claim 9, wherein said wall-like separators have inside wall surface means for engaging respective sides of the electrical component.

11. A clip connector as set forth in claim 6, wherein said levers each include an electrically non-conductive body in which are secured the mounting portions of the contact means at the corresponding side of said rectangular arrangement of contact means.

12. A clip connector as set forth in claim 11, wherein said coupling portions of said contact means secured to said levers project beyond upper ends of said levers to facilitate electrical connection to conductive elements of the external device.

13. An electrical clip connector for connecting conductive elements of an external device to conductive elements of a chip carrier or other electrical component including a body having plural pairs of opposed sides and plural conductive elements at each such side of the body, comprising:
   a multi-sided arrangement of electrical contact means having plural pairs of opposed sides and including a plurality of said contact means at each side of said multi-sided arrangement of contact means for effecting electrical connection between conductive elements of the external device and conductive elements of the electrical component at a corresponding side of the electrical component, each of a plurality of said contact means having a contacting portion for electrically connecting with a respective conductive element of the electrical component, a coupling portion for electrically connecting with a conductive element of the external device, and a mounting portion;

support/latching means for supporting said contact means at their mounting portions in said multi-sided arrangement and for holding said clip connector to the electrical component in operative position, said support/latching means including at least two latching elements mounted with respect to one another at respective opposed sides of said multi-sided arrangement of contact means for inward and outward movement towards and away from one another, means for urging said latching elements into gripping engagement with respective opposed sides of the electrical component, and hand operable means for urging said latching elements out of gripping engagement with opposed sides of the electrical component, each latching element including means coacting with at least one of the contact means at the corresponding side of said multi-sided arrangement of contact means to cause the contacting portion of said at least one of said contact means to move outwardly therewith.

14. A clip connector as set forth in claim 13, wherein said plurality of said contact means includes a plurality of generally parallel, elongated electrical contacts, each said contact having a forward end portion forming said contacting portion, a rearward end portion forming said coupling portion, and a portion intermediate said end portion forming said mounting portion.

15. A clip connector as set forth in claim 13, wherein said means for urging includes resilient means for yieldingly biasing said latching elements into gripping engagement with respective opposed sides of the electrical component.

16. A clip connector as set forth in claim 15, wherein said support/latching means includes four latching elements mounted with respect to one another at respective different sides of said multi-sided arrangement of contact means for movement into and out of gripping engagement with respective sides of the electrical component.

17. A clip connector as set forth in claim 13, wherein said support/latching means includes plural pairs of latching elements each mounted with respect to one another at respective different sides of said multi-sided arrangement of contact means for movement into and out of engagement with respective sides of the electrical component.

18. A clip connector as set forth in claim 17, wherein the latching elements of one said pair of latching elements include lower end portions of respective levers mounted with respect to one another for relative pivoting-like movement at respective opposite sides of said multi-sided arrangement.

19. A clip connector as set forth in claim 18, wherein said levers have respective upper end portions adapted to be squeezed towards one another to effect outward movement of said lower end portions.

20. A clip connector as set forth in claim 18, wherein said lower end portions of said levers include inwardly protruding teeth for engaging the underside of the electrical component when pivoted therebeneath.

21. A clip connector as set forth in claim 18, wherein said levers each include an electrically non-conductive body in which are secured the mounting portions of the contact means at the corresponding side of said multi-sided arrangement of contact means.

22. A clip connector as set forth in claim 21, wherein said coupling portions of said contact means secured to said levers project beyond upper ends of said levers to facilitate electrical connection to conductive elements of the external device.

23. A clip connector as set forth in claim 18, wherein said lower end portions of said levers include a plurality of wall-like separators for separating the contacting portions of said contact means at the corresponding sides of said multi-sided arrangement of contact means.

24. A clip connector as set forth in claim 23, wherein said wall-like separators have inside wall surface means for engaging respective sides of the electrical component.

* * * * *